United States Patent [19]

Borley

[11] 3,956,978
[45] May 18, 1976

[54] ELECTRIC TOASTERS
[75] Inventor: Richard George Borley, Trimley St. Martin, England
[73] Assignee: Best Products Limited, Manchester, England
[22] Filed: June 28, 1974
[21] Appl. No.: 484,009

[30] Foreign Application Priority Data
June 29, 1973 United Kingdom............... 31177/73

[52] U.S. Cl............................. 99/329 R; 219/502; 219/514
[51] Int. Cl.².......................................... A47J 27/00
[58] Field of Search........................... 219/502, 514; 99/329 RT, 378, 389, 329 R

[56] References Cited
UNITED STATES PATENTS
2,465,577  3/1949  Cox ................................ 99/329 RT
3,229,614  1/1966  Matzenauer ........................ 219/514
3,358,584  12/1967  Sutton et al...................... 99/329 R Primary Examiner—R. N. Envall, Jr.
Attorney, Agent, or Firm—Sughrue, Rothwell, Mion, Zinn and Macpeak

[57] ABSTRACT

An electric toaster in which a toast support bar is held down by an energized electric magnet so as to maintain bread, on the support bar, alongside electric heating elements. When the bread has been toasted to the desired degree, the electromagnet is de-energized, permitting springs to lift the support bar to pop-up the toast. The rising movement of the support bar causes a switch to operate which interrupts the electrical supply to the elements.

5 Claims, 22 Drawing Figures

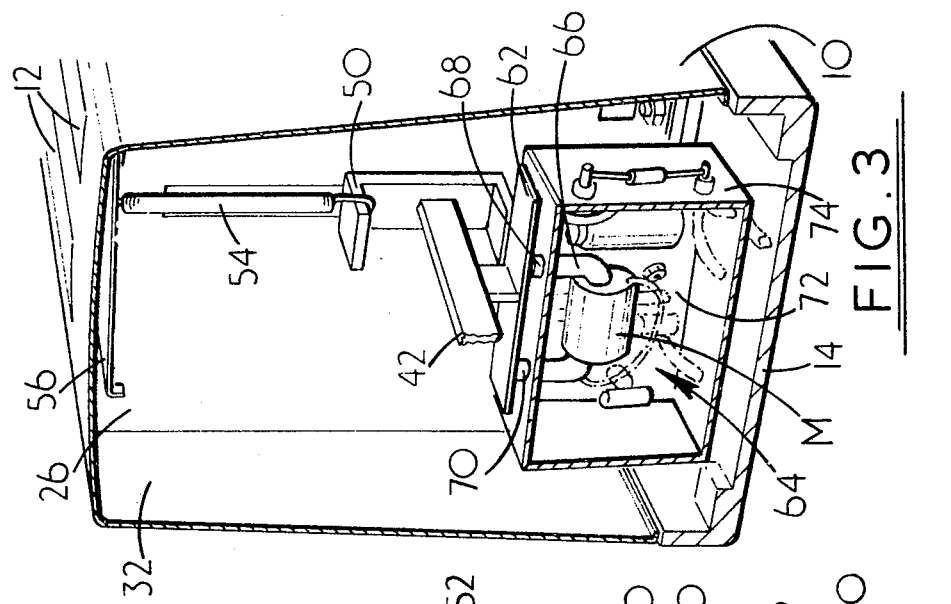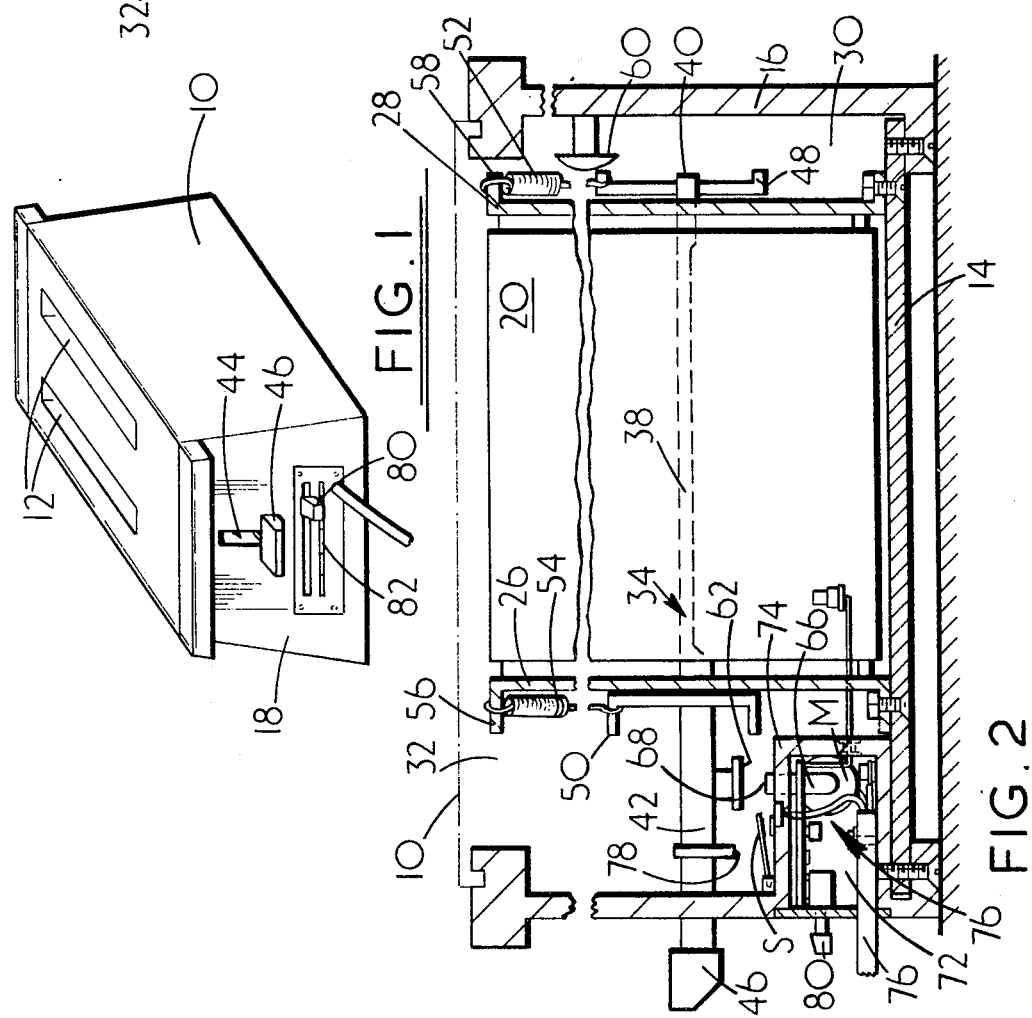

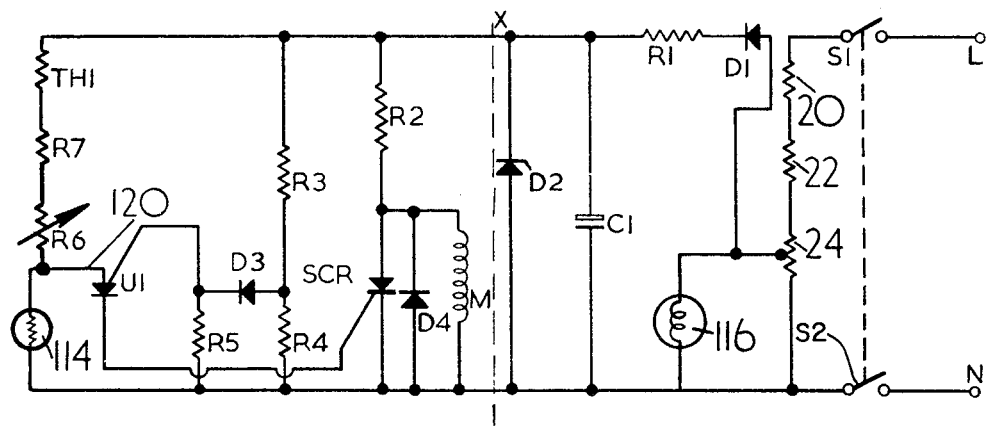
FIG. 7
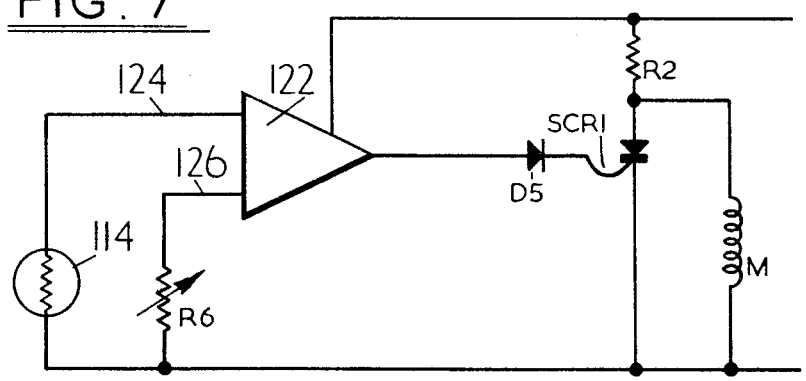
FIG. 8
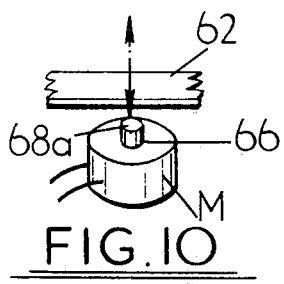
FIG. 10
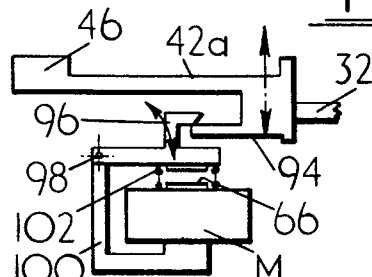
FIG. 13
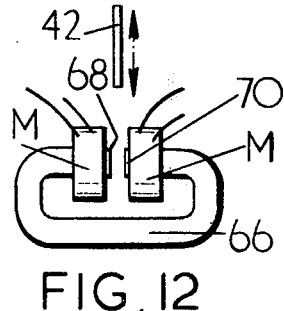
FIG. 12
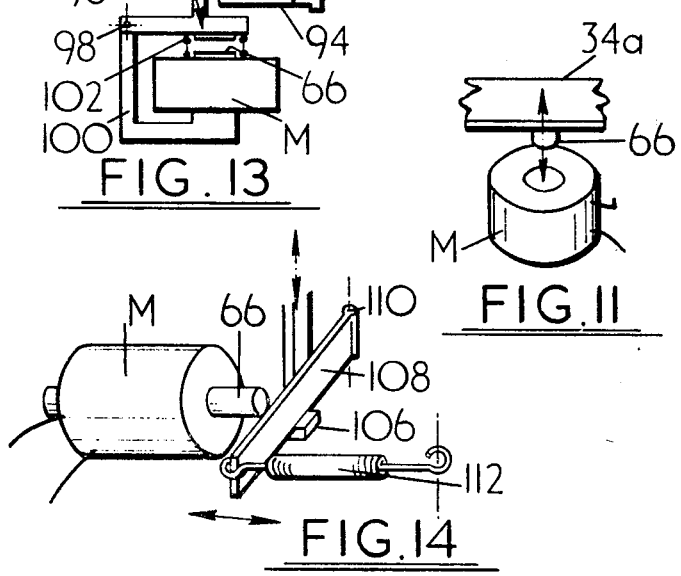
FIG. 11
FIG. 14

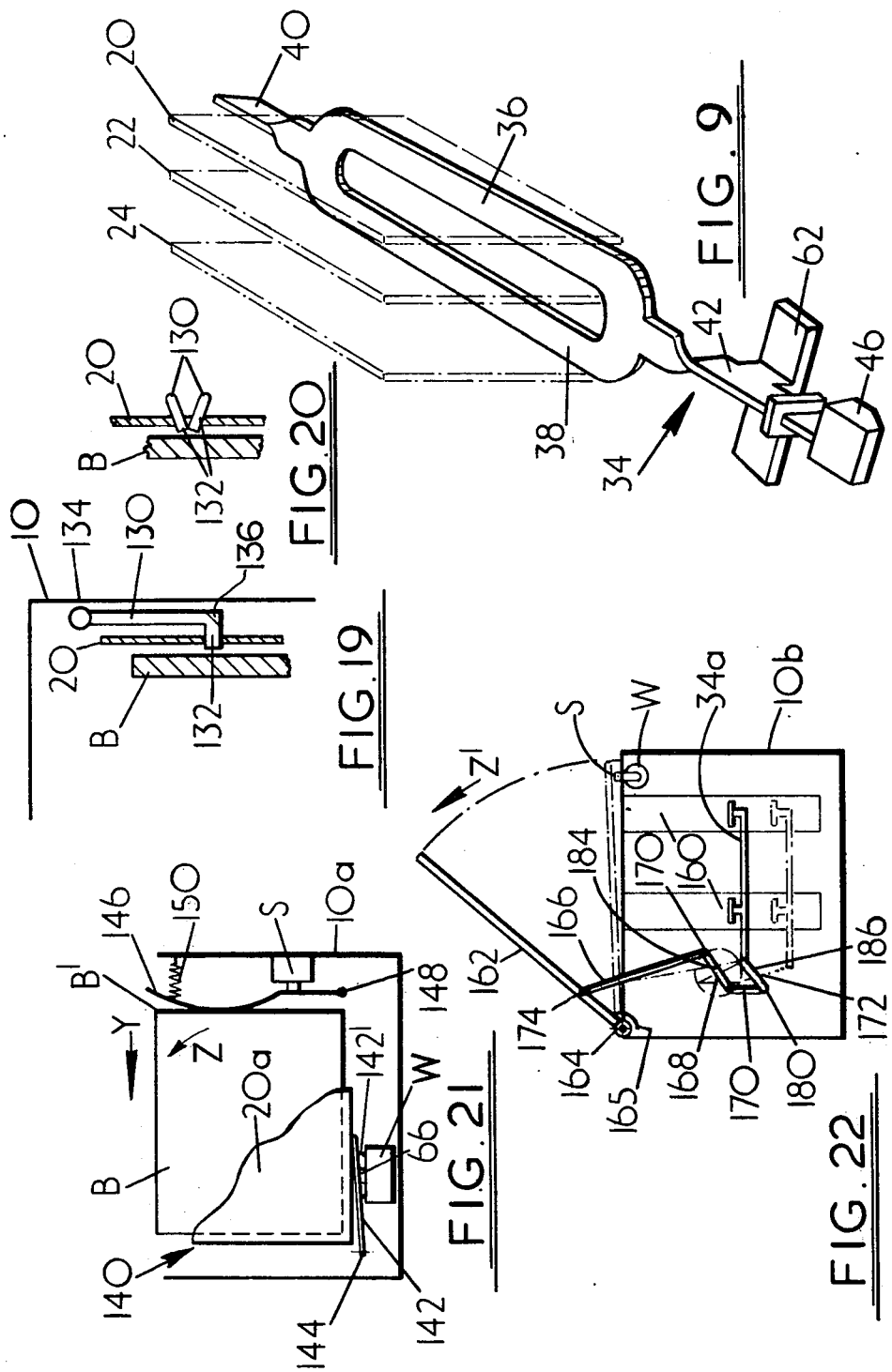

ELECTRIC TOASTERS

The invention relates to improvements in electric toasters, of the type having electric heating means for toasting one or more slices of bread simultaneously when the latter is disposed adjacent to the energized heating means.

According to the invention an electric toaster of the type referred to comprises switch means actuable to interrupt the supply of electricity to the heating means in response to a change in energy of electromagnetic means when a slice of bread is toasted to a desired degree.

The invention will now be further described with reference to the accompanying drawings in which:

FIG. 1 is a perspective view of a toaster formed according to the invention;

FIG. 2 is a fragmentary vertical, longitudinal section on an enlarged scale of the toaster in FIG. 1;

FIG. 3 is a fragmentary end view of the toaster in FIG. 1 on an enlarged scale;

FIG. 7 is a diagram of a further alternative circuit;

FIG. 8 is a diagram of a fragment of yet a further alternative circuit;

FIG. 9 is a fragmentary view on an enlarged scale of the toaster in FIG. 1, showing a toast support bar and heating elements;

FIGS. 10 to 12 are diagrammatic views and show variations of electromagnet holding devices which can be used in a toaster formed according to the invention;

FIGS. 13 and 14 are diagrammatic views of electromagnetically operated latch devices which can be used in a toaster formed according to the invention;

FIG. 19 is a fragmentary side view of a photoelectric control device for a toaster formed according to the invention incorporated in the circuit in FIGS. 7 or 8.

FIG. 20 is a fragmentary inverse plan view partly in section of the device in FIG. 19, and FIGS. 21 and 22 are fragmentary diagrammatic views of further alternative embodiments of toaster formed according to the invention.

In the drawings like references refer to like parts.

Figure 4:
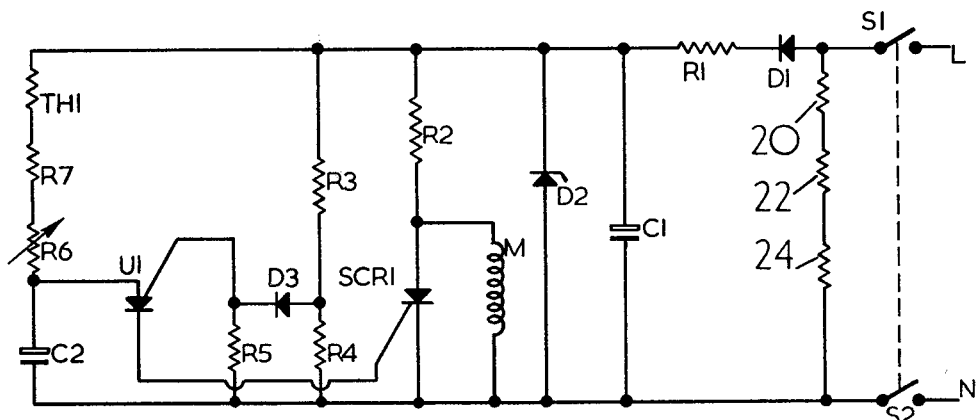
FIG. 4 is an electrical circuit diagram of the toaster in FIG. 1.

Referring to FIGS. 1 to 3 and 9, an electric toaster is formed with an external casing 10 with bread receiving slots 12 in its top and closed at its bottom by a base 14 and at its end by panels 16 and 18. Within the casing two bread toasting compartments are defined which have electrically powered heating elements 20, 22 and 24 of any suitable type on opposite sides. Opposite ends of the compartments are defined by internal walls 26 and 28 within the casing. Normal thermal insulation can be provided to prevent the casing overheating and the excess transmission of heat to compartments 30 and 32 within the casing and adjacent opposite ends thereof.

A toast support bar 34 is disposed in the toasting compartments and comprises two side parts 36 and 38 of a loop, each located between a respective pair of the heating elements 20, 22 and 24 and arms 40 and 42 projecting from opposite ends of the loop. Arm 40 extends through a vertical slot in the internal wall 28. Arm 42 extends through a vertical slot in internal wall 26, and also through a vertical slot 44 in the end panel 18. Beyond panel 18, arm 42 is provided with a manual push down handle 46 by which the support bar is lowered between the heating elements to locate bread to be toasted therealong. Each arm 40 and 42 has a respective bracket 48 and 50 mounted thereon to which a respective helical extension spring 52 and 54 is attached. The other end of each spring is attached to a respective upper flange 56 or 58 on the internal wall 26 or 28. Consequently, when the springs 52 and 54 are extended their natural tendency is to lift the support bar 34 so as to pop-up the toast. If desired a bell 60 can be positioned in compartment 30 so that it is struck by the flange 48 when about to reach its uppermost position to give an audible indication that the toast is ready.

To hold the support bar down so that bread can be toasted to the desired extent, an electromagnet holding device is provided. This device comprises a substantially horizontal plate 62 of ferrous magnetic material mounted on arm 42 and an electromagnet 64 comprising a U-shaped core 66 and field winding M. When the electromagnet is energized and the support arm lowered so that plate 62 contacts pole tips 68 and 70 of the core, the support bar is held down against the action of the spring by magnetic attraction, until the electromagnet is de-energized. The electromagnet is included in a control circuit 76 mounted in a sub-compartment 72 defined by an internal casing 74 within the casing 10. The control circuit is supplied with electric power from a suitable source for example, the A.C. main supply via a cable 76 and this current is fed to the control circuit and also to the heater elements 20, 22 and 24 when a normally open switch S connected to the control circuit is closed. As can be seen from FIG. 2, switch S is mounted on the top of the internal casing 74 and is closed by a projection 78 on the arm 42, pressing down on the switch when the support bar 34 is lowered.

A diagram of the control circuit is shown in FIG. 4. The switch S comprises a pair of normally open ganged switches S1 and S2 in a live line L and a neutral line N from the main. As soon as switches S1 and S2 are closed by the support bar being lowered to substantially its lowermost positon, and circuit is made through heating elements 20, 22 and 24 to toast bread slices sitting on the support bar. When switches S1 and S2 are closed, the resistance of the heating elements causes an initial and/relatively large drop in the voltage of the A.C. supply which is rectified by diode D1. Resistance R1 and Zener diode D2 further drop and stabilize the voltage to a desired value, and capacitor C1 smooths the rectified voltage. As soon as switches S1 and S2 are closed, the field winding M is energized via resistance R2 by the rectified supply so tht the electromagnet holds the support bar down.

The degree of toasting of the bread is a function of the time that the support bar is held down. This time can be varied within predetermined limits by manually positioning a potentiometer slider knob 80 (FIGS. 1 and 2) alongside a desired part of a degree of toasting scale 82 mounted on the panel 18. Returning to FIG. 4, the value of a variable resistance R6 in the control circuit is varied by moving the slider 80 (FIG. 1 and 2). Also included in the control circuit is a silicon controlled rectifier SCR1, a compensating diode D3, a unijunction transistor U1, a capacitor C2, a thermistor TH1 and resistances R3, R4, R5 and R7. As soon as switches S1 and S2 are closed capacitance C2 starts to charge through the variable resistance R6, the resistance R7 and the thermistor TH1 and on reaching a predetermined level set by resistances R3 and R4 and unijunction transistor U1 in the time goverened by the setting of the variable resistance R6, SCR1 receives a triggering pulse from the unijunction transistor. SCR1 becomes conducting and shorts out the field winding M, thus de-energizing the electromagnet. Consequently, the support bar is released and is raised by the springs 52 and 54. The switches S1 and S2 are then released and open automatically so that the supply to the heating elements and to the control circuit is interrupted.

The termistor TH1 is provided to compensate for the effects of change in temperature on the control circuit inside the toaster.

The core of the electromagnet is preferably of soft iron.

In place of an electromagnet with a U-shaped core as shown in FIG. 3 the electromagnet can be as shown in FIG. 10 in which the winding M surrounds a core 66 in the shape of a right cylinder having a pole tip 68a which attracts the plate 62 of the support bar (not shown) when the winding is energized. In FIG. 11 the core 66 in the form of a peg is permanently mounted on toast support bar 34a of the toaster (not shown) so that the core is lowered into the winding M when the support bar is lowered and is held within the winding when the latter is energized. In FIG. 12 the electromagnet has two windings M, one on each limb of a C-shaped core 66. The two windings are in series and are substituted for the single winding M in FIG. 4. In FIG. 12 the arm 42 or a depending plate-like member of ferrous material mounted thereon enters the gap between the pole tips 68 and 70 and is held therein by magnetic attraction when the windings are energized.

Figure 15:
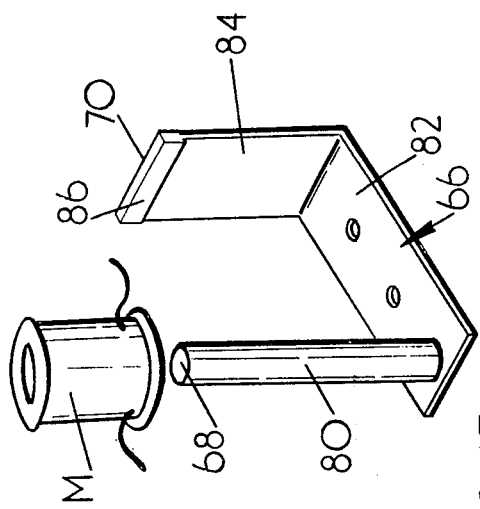
FIGS. 15 and 16 are respectively exploded and assembled diagrammatic views of an electromagnetic which can be used in the toaster formed according to the invention.
Figure 16:
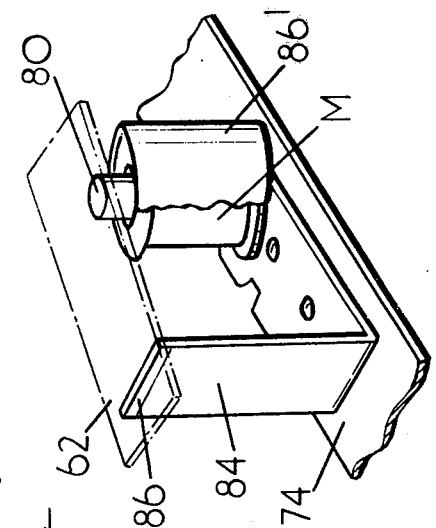

A modification of the U-shaped core 66 of the electromagnet is shown in FIGS. 15 and 16. In this instance the U-shaped core comprises a cylindrical ferro-magnetic arm 80 mounted on a ferro-magnetic, angled strip 82 providing the other arm 84 of the U. The winding M on a spool is surrounded by a heat shield 86¹ is fitted onto the arm 80. Both arms are of the same length.

The magnetic permeability of the free end of arm 84 is reduced by a coating of insulating material 86 thereon and therefore the reluctance is increased. As a result the magnetic field circuit, which extends through the plates 62 when the latter is in contact with the pole tips 68 and 70 and the winding M is energized, is extinguished very rapidly when the winding de-energizes. Consequently there is a reduced chance of the magnetic field being retained after de-energizing of the winding. Therefore a rapid release of the support bar is possible.

Figure 17:
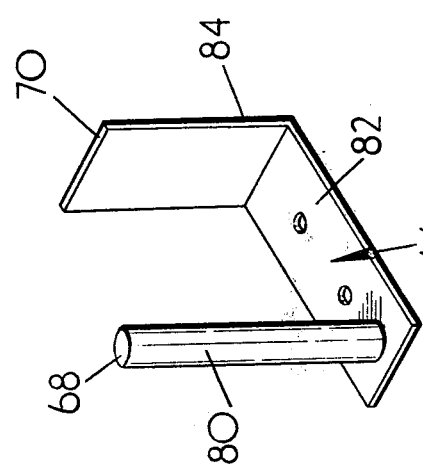
FIGS. 17 and 18 are diagrammatic views of alternative core assemblies which can be used in the electromagnet in FIGS. 15 and 16.
Figure 18:
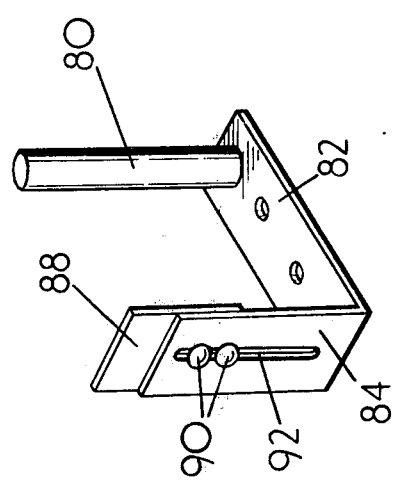

FIG. 17 shows a modification of the core 66 in FIGS. 15 and 16. In FIG. 17 the arm 84 is shorter than the arm 80 so that a high reluctance air gap exists between the pole tip 70 and the horizontal plate 62 (not shown) on the support bar 34 when the plate contacts the pole tip 68. Again the magnetic field circuit will be rapidly extinguished when the winding deenergizes. In a further modified core in FIG. 18 the arm 84 is shorter than arm 80. In this case a vertically movable strip 88 of ferro-magnetic material which may have a lower permeability than arm 84 is adjustably mounted thereon by bolts 90 in a vertical slot 92 in the arm 84 so that the size of the high reluctance air gap (described with reference to FIG. 17) can be varied as desired to achieve a desired speed of release of the support bar.

In FIG. 13 the support bar 34 has an arm 42a provided with the handle 46. This arm has a projection 94 engaged by a latch member 96 comprising ferro-magnetic material to hold down the support bar when the latter is lowered. The latch member 96 is pivoted at 98 on a stationary arm 100 and is normally urged upwardly by a compression spring 102. When the winding M is energized upon the support bar being lowered, the latch member 96 is attracted towards the core 66 and engages to projection 94 as shown. When the winding is de-energized, the magnetic attraction ceases and the spring 102 lifts the latch member and the support bar is released.

FIG. 14 shows a trip mechanism which includes a depending leg 104 mounted on the support bar (not shown). This leg has a foot 106 which is engageable by a trip 108 of ferro-magnetic material pivotably mounted at 110. The trip is urged away from the core 66 by an extension spring 112. When the winding M is energized upon the support bar being lowered, the trip is attracted towards the core and engages the foot 108 to hold down the support bar. When the winding M de-energizes, the trip 108 is pulled back by the spring 112 to release the leg 104 and thus allow the support bar to rise.

Figure 5:
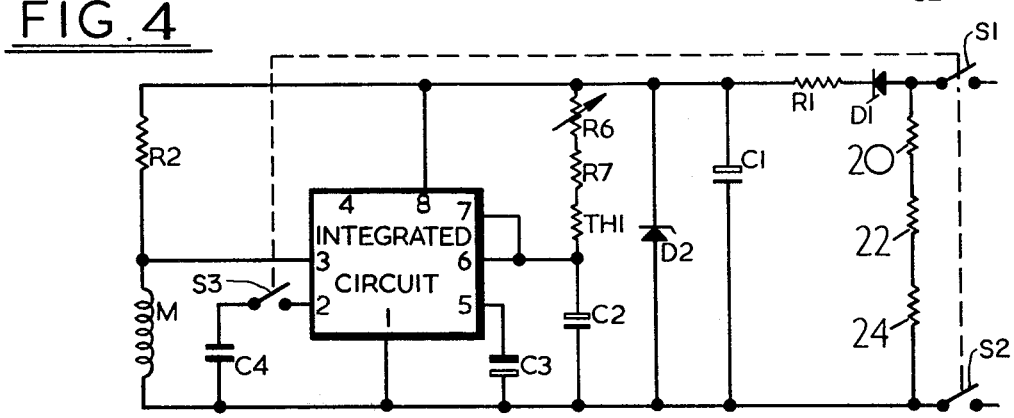
FIG. 5 is a diagram of an alternative circuit.
Figure 6:
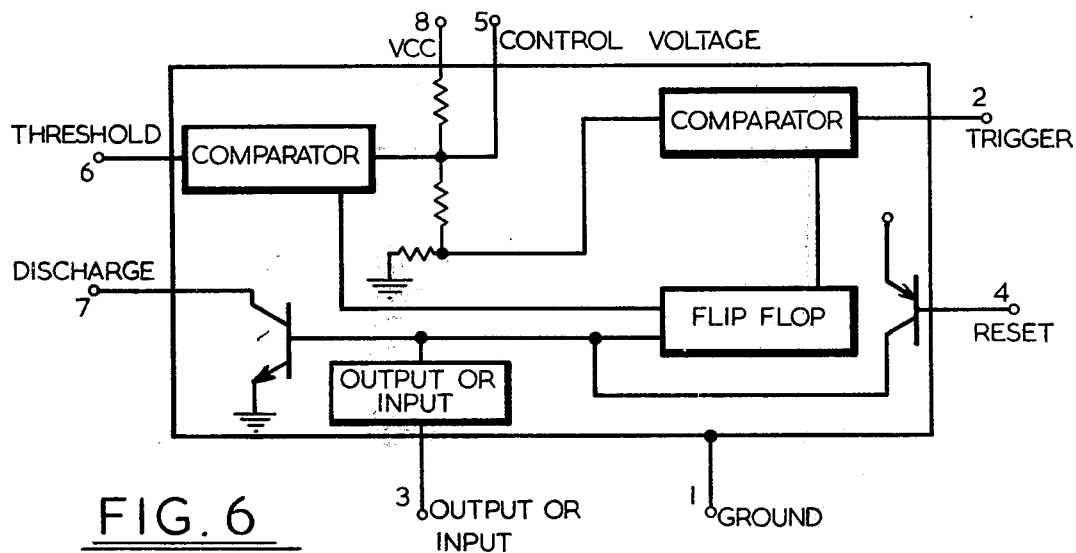
FIG. 6 is a circuit diagram of the integrated circuit used in FIG. 5.

In the modification of the control circuit in FIG. 5 an integrated circuit, illustrated in block diagram form in FIG. 6, is used. The integrated circuit can be an MC1455P1 of Motorola Semiconductor Products Inc. The switch S in FIG. 2 is comprised in the circuit in FIG. 5 by three ganged switches S1, S2 and S3. Switches S1 and S2 are normally open and are closed when the support bar 34 in FIG. 2 is lowered, whereas switch S3 is normally closed and is opened when the support bar is lowered. The control circuit includes capacitances C3 and C4. When the support bar is lowered so that switches S1 and S2 close and winding M becomes energized, switch S3 is opened whereby the integrated circuit receives a trigger pulse of zero volts on trigger terminal 2. Capacitance C2 starts to charge and on reaching the desired level in a predetermined time controlled by the setting of variable resistance R6, a conducting path opens in the integrated circuit via terminal 3 thereof thereby shorting out the field winding M so that the support bar is released and the electric supply to heating element 20, 22 and 24 interrupted.

Alternatively, switch S3 may be omitted and capacitor C4 connected between the terminal 2 and a tapping point on the field winding M. The charging of capacitor C2 will then be initiated by a negative pulse on the trigger terminal 2 as soon as the field winding M is supplied with current due to the closure of the switches S1 and S2 by the lowered support bar.

In the circuit in FIG. 7, the control includes a photoresistor 114 whose resistance increases as the amount of light incident thereon decreases, and a diode D4. The circuit illustrated is provided with an electric lamp 116 powered by a supply tapped from the heating element 24. The lamp 116 and photo-resistor 114 are arranged (in a manner to be subsequently described)

such that a beam of light from the lamp is directed onto a slice of bread being toasted and light from the beam reflected by the bread is incident on the photo-resistor. Therefore, the value of the resistance of the photo-resistor at any instant in time is a function of the degree of toasting of the bread. The unijunction transistor U1 sends a trigger pulse to fire SCR1 when the voltage drop across the photo-resistor 114 reaches a predetermined level. The voltage drop across photo-resistor 114 increases as the value of the resistance of photo-resistor increases, but as this voltage drop is also a function of the combined value of the resistances of thermistor TH2, resistor R7 and variable resistor R6, the time when voltage drop across the photo-resistor increases to the predetermined level is a function of the resistance value of the variable resistor. Therefore, variable resistance R6 is set at a resistance value to give the desired degree of toasting, and the voltage drop across the photo-resistor reaches the predetermined level when the resistance of the photo-resistor increases to a value commensurate with that desired degree. SCR1 is then fired and the field winding M is shorted out thereby.

The control circuit in FIG. 8 is connected to the portion of the circuit in FIG. 7 to the right hand side of the dotted line X. This control circuit includes a diode D5 and a differential amplifier 122 which gives a voltage output signal which increases in value the greater the difference between the input voltage signals on lines 124 and 126.

The variable resistor R6 is set at a value commensurate with the desired degree of toasting. When this desired degree is reached, the difference between the input signal on line 126 and the value of the input signal on line 124, due to the increase in resistance value of the photo-resistor 114, is sufficient for the output signal from the amplifier 122 to have increased to a value which fires SCR1. Therefore, field winding M is shorted out.

The arrangement in FIGS. 19 and 20 show the manner in which the photo-resistor and the lamp can be mounted on the toaster. A pair of similar tubes 130 are stationarily mounted in the toaster. Each tube is bent at substantially a right angle and projects through the heating element 20 so that open ends 132 of the tubes face generally towards a side of a slice of bread B being toasted. The other end of each of the tubes leads into a respective chamber 134 (only one shown). One chamber 134 contains the lamp 116 in FIG. 7 and the other chamber contains the photo-resistor 114 in FIGS. 7 and 8. A prism or reflector 136 is located in the corner of each tube to turn through 90°a beam of light passing along the tube. As can be seen in FIG. 20, the tubes 130 are at an angle one with the other to ensure the beam of light issuing from one tube enters the other after reflection by the bread.

In the modifications of the toaster in FIGS. 21 and 22, the control circuit and the switch S and the electromagnetic holding means with its winding W can be as described above.

In FIG. 21, the toaster has a casing 10a in which there is at least one open-topped toasting compartment 140 having a pair of heating elements 20a defining one pair of opposite sides of the compartment, one of the other pairs of sides of the compartment is open so that an edge B¹ of a piece of bread B in the compartment projects from the open side. The compartment is affixedly mounted on an arm 142 which can pivot about a stationary pivot point 144. This arm is of ferro-magnetic material and abuts against a pole tip of the core 66 of an electromagnet. Disposed adjacent to the open side of the compartment 140 is a strip 146 which can pivot about a stationary pivot 148. The strip is biased by a compression spring 150 so that the strip is normally pushed in the direction of arrow Y so as not to actuate the switch S. When a piece of bread is inserted in the compartment 140 the edge B¹ pushes against the strip 146 and actuates the switch S so that the field winding W is energized. When the bread is toasted to the desired degree the winding W is de-energized as described previously so the magnetic hold ceases. The spring 150 can then expand to push the strip 146 in the direction of arrow Y away from the switch S to interrupt the electric supply to the toaster. This movement of the strip 146 pushes the bread edge B¹ and so causes the toasted bread B and the compartment 140 to pivot in the direction of the arrow Z to pop-up a corner of the toast. A compression spring 142' can be provided intermediate the arm 142 and the winding W to urge the arm 142 upwardly when the electro-magnet de-energizes.

The toaster in FIG. 22 has a casing 10b containing toasting compartments 160 with sides defined by electric heating elements (not shown). A toast support bar 34a is common to both compartments and is constrained to move vertically. The toaster has a pivotable cover 162 pivotably mounted at 164 on the casing. A spring 165 urges the cover in a cover opening direction indicated by arrow Z¹. The cover is connected to the support bar by pivoted links 166, 168, 170 and 172 the pivot points being shown at 174 to 186. Pivot points 184 and 186 are stationary. When cover 162 is in the fully open position, the support bar 34a is raised to its highest level. Bread to be toasted is inserted in the compartments 160 and the cover 162 is closed, thus lowering the support bar 34a to the position shown in dotted lines. In the closed position the cover presses on switch S and contacts the core 66 of the electromagnet whose winding W is energized as previously described. The electromagnet holds the cover closed until the bread is toasted to the desired degree. Then the winding W de-energizes and the cover is swung open by the spring 165. Switch S then actuates to interrupt the electrical supply to the toaster. As the cover opens, the support bar 34a is lifted to pop-up the toast.

The toaster in FIG. 21, for example, may be modified by the omission of the strip 146 and springs 142', 150, and the switch S arranged for closure by the bread edge B¹ when the bread is inserted in the compartment and pushed down. The core 66 can be biased upwardly by a spring so as to tend to urge the compartment 140 to pivot upwards. However, when the switch S is closed a solenoid defined by the winding W draws the core 66 down against its spring loading, and the compartment 140 and bread B remain in a lowered position until the bread is toasted to the desired degree. Then the solenoid winding W de-energizes, and the core 66 is moved upwardly by the spring to lift the compartment and also the bread B away from the switch S which then interrupts the electric supply. The compartment 140 need not be pivotable and may be open at its bottom so that the lower edge of the bread rests on the solenoid 66.

The circuits described above may also be modified such that the magnetic holding means is energized, when the bread has been toasted to the desired degree, to move a latch thereby permitting release of the toast support or closed cover.

If desired the support bar 34, push down arm 42, pivoting compartment 140 or cover 162 can be held down, when the bread is inserted in the toaster, by engagement by a mechanical latch. The latch is actuated to release the support bar, push down arm, compartment or cover when the field winding is energized. In this case, the field winding M in FIGS. 4, 7 and 8 is in series with SCR1, instead of in parallel. Consequently, when SCR1 is fired, when the bread has been toasted to the desired degree, the field winding is energized. When such a latch is used in a toaster controlled by the circuit in FIG. 5, the field winding M is energized by action of the integrated circuit when the bread is toasted to the desired degree.

The electronic circuits may be printed circuits and/or can be on a single chip as an integrated circuit.

The toaster described has a number of advantages:

1. The support bar or cover can be arranged to be readily moved clear of the influence of the electromagnet when desired.
2. The support bar or cover cannot be held in a lowered or closed position unless the toaster is connected to the main.
3. The electromagnet cannot be supplied with current accidentally by connecting to the main unless the support bar is lowered or the cover closed thereafter.
4. Less wear and tear when purely magnetic holding is used.
5. Reliable accurate toasting.

What is claimed is:

1. An electric toaster comprising a casing formed with an opening leading to an interior of the casing whereby a slice of bread to be toasted can be inserted into said interior, electrically energizable heater means mounted in the casing for applying bread toasting heat to the inserted slice, bread supporting means mounted in the casing for movement in opposite directions inwardly and outwardly of the casing, at least one element of ferro-magnetic material attached to the bread supporting means, spring means mounted in the casing and urging said bread supporting means in the direction outwardly of the casing, said bread supporting means being movable inwardly of the casing into a toasting position where the bread supporting means supports the slice alongside the heater means, electro-magnetic means mounted in the casing, said electro-magnetic means being energizable to generate a magnetic field exerting a holding attraction on said ferro-magnetic material for holding the bread supporting means in said toasting position, said electromagnetic means being de-energizable to terminate said magnetic field and release said bread supporting means from the toasting position by the force of said spring means, an electric circuit mounted in the casing, said circuit including the heater means, said electro-magnet means and switch means operable by the insertion of the slice for establishing a first current path through said heater means and a second current path through said electromagnet means, said switch means being operable for interrupting the supply of current to the circuit by the outward movement of the bread supporting means, and degree of toasting control means included in said circuit and operable for de-energizing said electro-magnet holding means upon the slice becoming toasted to a desired degree.

2. An electric toaster comprising a casing formed with an opening leading to an interior of the casing whereby a slice of bread to be toasted can be inserted into said interior, electrically energizable heater means mounted in the casing for applying bread toasting heat to the inserted slice, bread supporting means mounted in the casing for movement in opposite directions inwardly and outwardly of the casing, spring means mounted in the casing and urging said bread supporting means in the direction outwardly of the casing, said bread supporting means being movable inwardly of the casing into a toasting position where the bread supporting means supports the slice alongside the heater means, electro-magnetic holding means mounted in the casing and operable when energized for holding the bread supporting means in said toasting position and for releasing said bread supporting means when de-energized, an electric circuit mounted in the casing, said circuit including the electro-magnetic holding means and switch means operable by the insertion of the slice for establishing an energizing current path through said electro-magnetic holding means, degree of toasting control means included in said circuit and operable for de-energizing said electromagnetic holding means upon the slice becoming toasted to a desired degree, said switch means operable for interrupting the supply of current to the circuit by movement of toast in the outward direction under propulsion by said spring means, and wherein the toast support means is a carriage, a lid is pivotably mounted on the casing for closing and opening said opening in the casing, a pivoted linkage is mounted on the casing and interconnects the lid and carriage whereby a closure movement of the lid moves said carriage inwardly of the casing and outward movement of the carriages raises said lid, and said switch means being mounted on the casing for actuation by movement of the lid whereby closure of the lid makes the switch means and the switch means breaks by opening of the lid.

3. An electric toaster comprising a casing formed with an opening leading to an interior of the casing whereby a slice of bread to be toasted can be inserted into said interior, electrically energizable heater means mounted in the casing for applying bread toasting heat to the inserted slice, bread supporting means mounted in the casing for movement in opposite directions inwardly and outwardly of the casing, spring means mounted in the casing and urging said bread supporting means in the direction outwardly of the casing, said bread supporting means being movable inwardly of the casing into a toasting position where the bread supporting means supports the slice alongside the heater means, electromagnetic holding means mounted in the casing and operable when energized for holding the bread supporting means in said toasting position and for releasing said bread supporting means when de-energized, an electric circuit mounted in the casing, said circuit including the electro-magnetic holding means and switch means operable by the insertion of the slice for establishing an energizing current path through said electro-magnetic holding means, degree of toasting control means included in said circuit and operable for de-energizing said electro-magnetic holding means upon the slice becoming toasted to a desired degree, said switch means operable for interrupting the supply of current to the circuit by movement of toast in the outward direction under propulsion by said spring means, and wherein said switch means is makeable by pressure thereagainst and breakable upon release of said pressure, and the switch means is mounted for a slice of bread inserted in said casing to press thereagainst.

4. An electric toaster comprising a casing formed with an opening leading to an interior of the casing whereby a slice of bread to be toasted can be inserted into said interior, electrically energizable heater means mounted in the casing for applying bread toasting heat to the inserted slice, bread supporting means mounted in the casing for movement in opposite directions inwardly and outwardly of the casing, spring means mounted in the casing and urging said bread supporting means in the direction outwardly of the casing, said bread supporting means being movable inwardly of the casing into a toasting position where the bread supporting means supports the slice alongside the heater means, electro-magnetic holding means mounted in the casing and operable when energized for holding the bread supporting means in said toasting position and for releasing said bread supporting means when de-energized, an electric circuit mounted in the casing, said circuit including the electro-magnetic holding means and switch means operable by the insertion of the slice for establishing an energizing current path through said electro-magnetic holding means, degree of toasting control means included in said circuit and operable for de-energizing said electro-magnetic holding means upon the slice becoming toasted to a desired degree, a source of light mounted in the casing for directing a beam of light onto the slice of bread being toasted, photoelectric means provided for light reflected from a surface of the slice to make incidence on the photoelectric means, said photoelectric means providing a first electrical signal which varies in response to the decrease in the amount of light incident thereon as the bread is toasted a progressively darker color, differential amplifier means arranged to receive the first electrical signal on one input and receive a second electrical signal on a second input, signal generator means providing said second signal at a value which is selectively variable and a function of the desired degree of toasting, thyristor means mounted electrically in parallel with field winding means of electro-magnetic means, an output of the differential amplifier connected to a triggering electrode means of said thyristor means, the arrangement being such that when the difference in values between the first and second signals reaches a predetermined value, the amplifier means gives an output signal which fires the thyristor means to provide a conducting path short circuiting said field winding means.

5. An electric toaster as claimed in claim 4 in which the photoelectric means is a photoresistor and the signal generating means is a variable resistance.

* * * * *